US012806736B2

(12) United States Patent
Yamada et al.

(10) Patent No.: US 12,806,736 B2
(45) Date of Patent: Nov. 24, 2026

(54) CHEMICAL MECHANICAL POLISHING PROCESS USING STEAM FOR POLISHING FLUID DELIVERY AND AN APPARATUS FOR IMPLEMENTING THE SAME

(71) Applicant: Sandisk Technologies, Inc., Milpitas, CA (US)

(72) Inventors: Yohei Yamada, Yokkaichi (JP); Koji Kishimoto, Yokkaichi (JP); Minoru Yamaguchi, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 411 days.

(21) Appl. No.: 18/462,830

(22) Filed: Sep. 7, 2023

(65) Prior Publication Data

US 2025/0083282 A1 Mar. 13, 2025

(51) Int. Cl.

*B24B 57/02* (2006.01)
*B24B 37/04* (2012.01)
*H10P 52/40* (2026.01)
*H10P 74/00* (2026.01)

(52) U.S. Cl.

CPC ............ *B24B 57/02* (2013.01); *B24B 37/044* (2013.01); *H10P 52/402* (2026.01); *H10P 74/238* (2026.01)

(58) Field of Classification Search

CPC ..... B24B 57/02; B24B 37/044; B24B 37/015; H10P 52/402; H10P 74/238

See application file for complete search history.

(56) References Cited

U.S. PATENT DOCUMENTS

| | | | | |
|---|---|---|---|---|
| 6,660,638 | B1 * | 12/2003 | Wang ........................ | C09G 1/02 438/692 |
| 10,593,603 | B2 | 3/2020 | Izumi et al. | |
| 2019/0287866 | A1 | 9/2019 | Izumi et al. | |
| 2020/0262024 | A1 * | 8/2020 | Chang ..................... | B24B 55/02 |
| 2021/0402552 | A1 * | 12/2021 | Kumar .................. | B24B 37/015 |
| 2022/0410338 | A1 | 12/2022 | Yagi | |
| 2023/0150084 | A1 | 5/2023 | Yatsuzuka | |

FOREIGN PATENT DOCUMENTS

JP 2007035973 A * 2/2007

* cited by examiner

*Primary Examiner* — Eliseo Ramos Feliciano
*Assistant Examiner* — Sophia W Kao
(74) *Attorney, Agent, or Firm* — THE MARBURY LAW GROUP PLLC

(57) ABSTRACT

A chemical mechanical polishing method includes providing a liquid-gas polishing fluid mixture to a polishing pad, and polishing a surface of a work piece on the polishing pad using the liquid-gas polishing fluid mixture.

8 Claims, 2 Drawing Sheets

CHEMICAL MECHANICAL POLISHING PROCESS USING STEAM FOR POLISHING FLUID DELIVERY AND AN APPARATUS FOR IMPLEMENTING THE SAME

FIELD

The present disclosure relates generally to the field of semiconductor manufacturing, and specifically to a chemical mechanical polishing process using steam for polishing fluid delivery and an apparatus for implementing the same.

BACKGROUND

Chemical mechanical polishing (CMP) is a process that forms smooth and planarized surfaces by removing protruding portions of a structure having topographic height variations. CMP is employed during semiconductor manufacturing to planarize top surfaces of patterned structures of semiconductor devices.

SUMMARY

According to an aspect of the present disclosure, a chemical mechanical polishing method includes providing a liquid-gas polishing fluid mixture to a polishing pad, and polishing a surface of a work piece on the polishing pad using the liquid-gas polishing fluid mixture.

According to another aspect of the present disclosure, a chemical mechanical polishing (CMP) apparatus comprises a platen configured to support a polishing pad thereupon; a wafer carrier configured to hold a wafer and to press the wafer against a top surface of the polishing pad; and a polishing fluid dispensation system. The dispensation system comprises a polishing fluid tank configured to store a polishing fluid containing at least one liquid phase material; a vaporizer configured to convert the polishing fluid into polishing fluid mixture of a gas and a liquid; a carrier gas supply system configured to provide a heated carrier gas; a mixer configured to mix the polishing fluid mixture and the carrier gas to form a liquid-gas polishing fluid mixture; and a polishing fluid conduit configured to provide the liquid-gas polishing fluid mixture over the polishing pad.

DETAILED DESCRIPTION

As discussed above, the embodiments of the present disclosure are directed to a chemical mechanical polishing process using steam for polishing fluid delivery and an apparatus for implementing the same, the various aspects of which are described below.

Precise control of the polishing pad temperature is desired to provide an optimal polish rate. The pad temperature is often controlled by providing hot liquid water to a slider located over the pad. However, the hot water pipe in the slider may become clogged, which reduces the pad temperature. A reduced pad temperature decreases the CMP polishing rate, which increases processing time and increases the amount of polishing fluid used to polish a wafer. Furthermore, in prior art silicon CMP processes, abrasive particles are used to facilitate the silicon CMP process. However, the abrasive particles tend to agglomerate at elevated temperatures and induce surface scratches on polished silicon surfaces.

According to an aspect of the present disclosure, an abrasive-free polishing fluid (also referred to as an abrasive-free "slurry") can be employed for a CMP process. By eliminating abrasive particles in the polishing fluid, the CMP process reduces scratches in the polished surface, such as a polished silicon surface. Steam is used in conjunction with the polishing fluid to elevate the temperature of the polishing pad, and to reduce the polishing fluid consumption by increasing the polishing rate. The efficiency and effectiveness of the CMP process can be enhanced while maintaining high polished surface quality and reducing polishing fluid consumption. The various aspects of the present disclosure are described with reference to accompanying drawings below.

Figure 1:
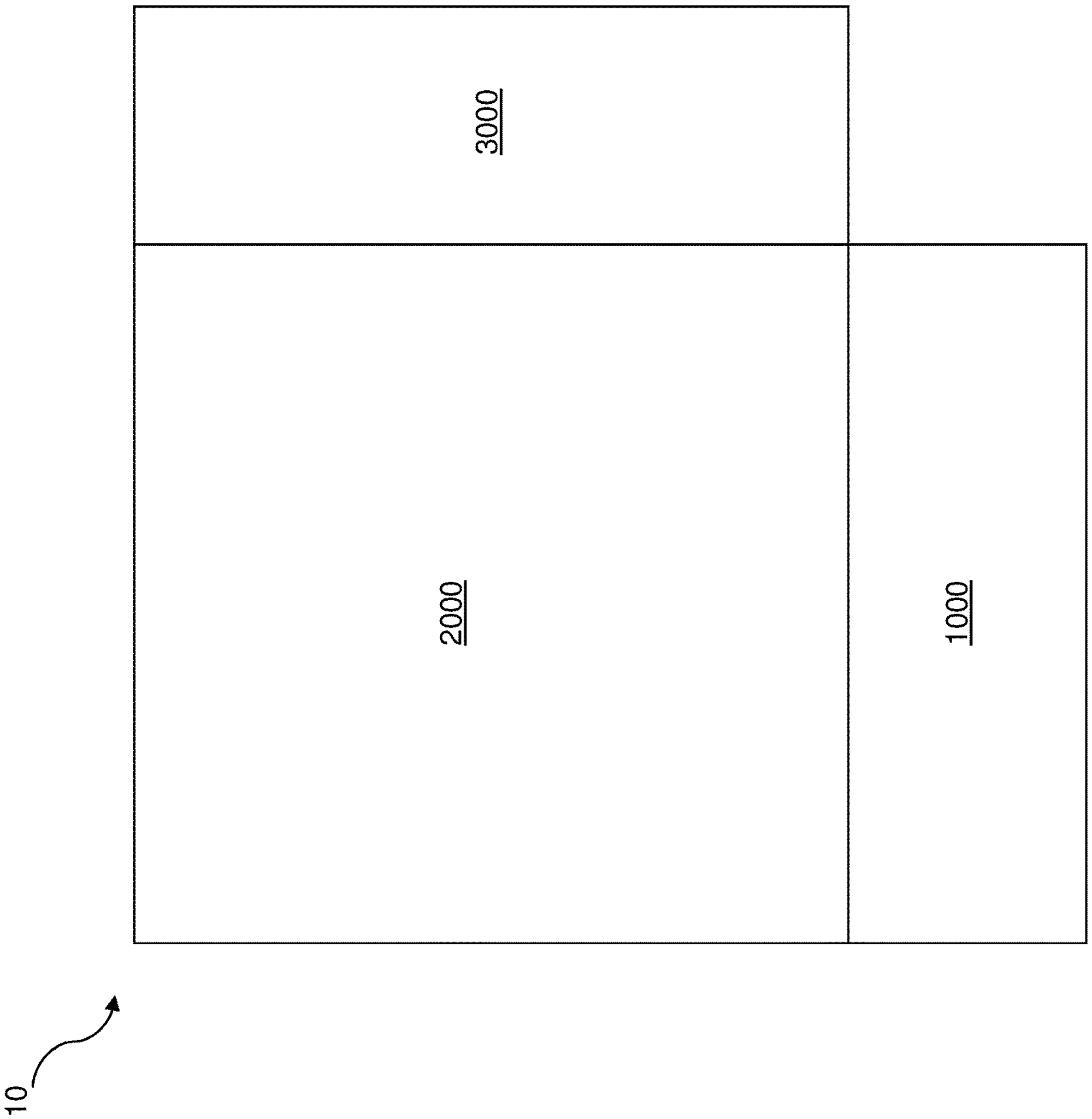
FIG. 1 is a to schematic view of an exemplary chemical mechanical polishing system according to an embodiment of the present disclosure.

Referring to FIG. 1, an exemplary chemical mechanical polishing (CMP) system 10 according to an embodiment of the present disclosure is illustrated in a plan view. The exemplary CMP system 10 may comprise a cluster tool which comprises a loading/unloading unit 1000, a CMP apparatus 2000, and a wafer cleaning apparatus 3000 include a set of cleaning chambers.

The loading/unloading unit 1000 is configured to mount at least one open cassette, at least one SMIF (Standard Manufacturing Interface) pod, and/or at least one FOUP (Front Opening Unified Pod). Each cassette, each SMIF pod, and/or each FOUP are configured to hold a plurality of wafers (e.g., silicon wafers), such as 25-30 wafers. The SMIF and the FOUP are an airtight container that can house a wafer cassette, and can be sealed to provide an airtight environment to wafers located within the wafer cassette. At least one transfer robot (not shown) can be provided within the loading/unloading unit 1000 and/or within the CMP apparatus 2000 to transport wafers from the loading/unloading unit 1000 to the CMP apparatus 2000.

Figure 2:
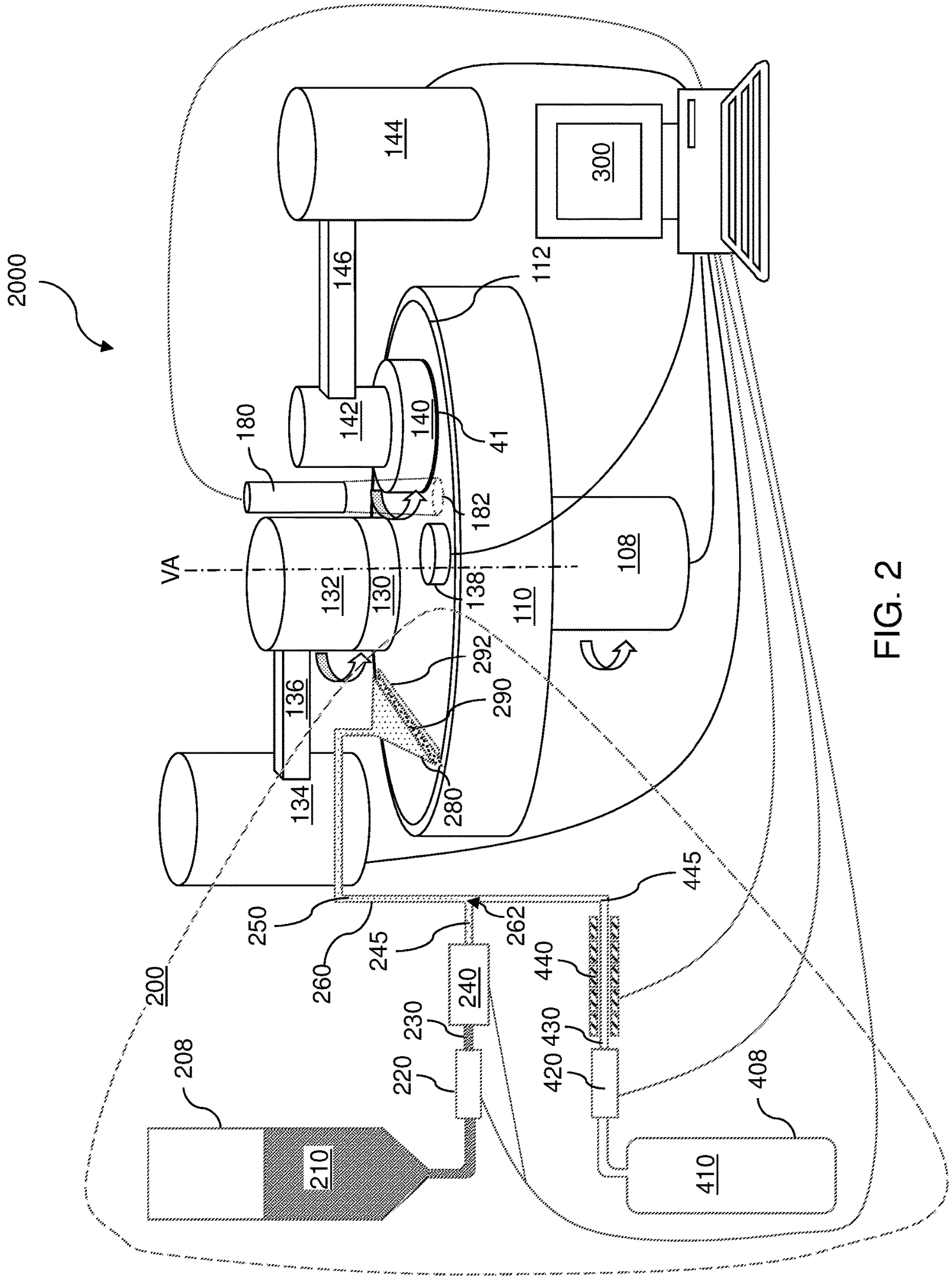
FIG. 2 is a schematic perspective view of a chemical mechanical polishing apparatus according to an embodiment of the present disclosure.

Referring to FIG. 2, the CMP apparatus 2000 within the exemplary CMP system 10 is illustrated. The CMP apparatus 2000 includes a polishing pad 112 located on a top surface of a platen 110, a wafer carrier 140 that is configured to hold a work piece (such as a wafer 41) upside down, a polishing fluid dispensation system 200 that is configured to dispense liquid-gas polishing fluid mixture 250 over the top surface of the polishing pad 112, an optional pad conditioning unit (130, 132) that can be used to condition the top surface of the polishing pad 112, and an optional slider 138 that may be used to control a temperature of the polishing pad 112.

The platen 110 can have a generally cylindrical shape, and can have a circular top surface that can be large enough to accommodate the polishing pad 112. The polishing pad 112 can have a generally circular horizontal-cross-sectional shape with a diameter that is at least twice the diameter of the wafer 41. For example, in embodiments in which the diameter of the wafer 41 is 300 mm, the diameter of the polishing pad 112 can be at least 600 mm. In embodiments in which the diameter of the wafer 41 is 450 mm, the diameter of the polishing pad 112 can be at least 900 mm. Generally, the ratio of the diameter of the polishing pad 112 to the diameter of the wafer 41 can be in a range from 2 to 6, such as from 2.5 to 4, although greater or lesser ratios can be used. The polishing pad 112 can include a textured top surface that is employed as a polishing surface during a polishing operation. The polishing pad 112 of the embodiments of the present disclosure includes debris 124 extraction tunnels connected to perforation holes in an upper polishing pad layer. Methods for manufacturing the polishing pad 112 of the present disclosure, and the structural features of the polishing pad 112 are described below in more detail with accompanying drawings.

The platen 110 can be configured to rotate around a vertical axis (VA) passing through the geometrical center of the platen 110. For example, a platen motor assembly 108 can be provided underneath the platen 110, and can rotate the platen 110 around the vertical axis (VA) passing through the geometrical center of the platen 110. As used herein, a geometrical center of an object refers to a center of mass of a hypothetical object occupying the same volume as the object and having a uniform density throughout. If an object has a uniform density, the geometrical center coincides with the center of gravity. The platen 110 can be configured to provide a rotational speed in a range from 10 revolutions per minute to 240 revolutions per minute, although faster or slower rotational speed can be used.

The wafer carrier 140 can be configured to hold the wafer 41 on a bottom surface thereof. Thus, the wafer carrier 140 can press the wafer 41 onto the top surface of the polishing pad 112. In one embodiment, the wafer carrier 140 can include a vacuum chuck configured to provide suction to the backside of the wafer 41. In one embodiment, differential suction pressures can be applied across different backside areas of the wafer 41. For example, the suction pressure applied to the center portion of the wafer 41 can be different from the suction pressure applied to the peripheral portion of the wafer 41 to provide uniform polishing rate across the entire area of the front side of the wafer 41 that contacts the polishing pad 112. In one embodiment, the wafer carrier 140 can include a retaining ring having an annular shape and configured to hold the wafer 41 therein so that the wafer 41 does not slide out from underneath the wafer carrier 140.

A polishing head 142 can be provided over the wafer carrier 140. The polishing head 142 can include a rotation mechanism that provides rotation to the wafer carrier 140. In some embodiments, a gimbal mechanism can be provided between the rotation mechanism and the wafer carrier 140 so that the wafer carrier 140 tilts in a manner that provides maximum physical contact between the entire front surface of the wafer 41 and the polishing pad 112. The combination of the polishing head 142 and the wafer carrier 140 constitutes a wafer polishing unit (140, 142) that positions and rotates the wafer 41 in a manner that induces polishing of material portions on the front side of the wafer 41 through abrasion caused by sliding contact with the top surface of the polishing pad 112.

In one embodiment, the wafer 41 and the wafer carrier 140 can rotate around the vertical axis (not illustrated) passing through the geometrical center of the wafer carrier 140. A polishing pivot pillar structure 144 can be affixed to a frame (not shown) of the CMP apparatus such that the polishing pivot pillar structure 144 can rotate around a vertical axis (not illustrated) passing through the geometrical center of the polishing pivot pillar structure 144. The vertical axis passing through the geometrical center of the polishing pivot pillar structure 144 can be stationary relative to the frame of the CMP apparatus.

A polishing arm 146 mechanically connects the polishing head 142 to the polishing pivot pillar structure 144. Thus, upon rotation of the polishing pivot pillar structure 144 around the vertical axis passing through the geometrical center of the polishing pivot pillar structure 144, the polishing arm 146 can rotate around the vertical axis passing through the geometrical center of the polishing pivot pillar structure 144. The polishing head 142 can move around the vertical axis passing through the geometrical center of the polishing pivot pillar structure 144 over the polishing pad 112. Lateral movement of the wafer polishing unit (140, 142) over the polishing pad 112 can enhance uniformity of polish rate across the wafer 41 during the CMP process.

The polishing fluid dispensation system 200 can be configured to dispense a liquid-gas polishing fluid mixture 250 over the top surface of the polishing pad 112. As used herein, the liquid-gas polishing fluid mixture 250 includes a gas containing a liquid vapor (i.e., liquid droplets) of a CMP polishing fluid immersed therein. The polishing fluid is typically referred to as a slurry. However, when the polishing fluid contains no solid abrasive particles, it is technically a liquid rather than a solid-liquid "slurry". The gas may comprise steam (i.e., water in the gas phase), and optionally a carrier gas, such as air. The steam may also include droplets of water vapor (i.e., water in the gas phase) immersed therein. The liquid vapor of the CMP polishing fluid may comprise droplets of a liquid that has a boiling point or decomposition temperature higher than a boiling point of water, and that acts as an etchant for the material on the wafer being polished by CMP.

The polishing fluid dispensation system 200 may comprise a polishing fluid tank 208 including a polishing fluid 210 containing at least one liquid phase material, and preferably excluding solid abrasive particles, such as an abrasive-free polishing fluid 210. According to an aspect of the present disclosure, for silicon CMP, the liquid phase materials may comprise and/or may consist essentially of liquid water and tetramethylammonium hydroxide (TMAH). For example, the at least one liquid phase material may comprise a TMAH aqueous solution containing 2 to 25% TMAH in water. TMAH decomposes at temperatures above the boiling point of water. Specifically, TMAH decomposes at above 108 degrees Celsius, such as above 130 degrees Celsius, for example at about 135~140 degrees Celsius. In contrast, water boils at 100 degrees Celsius. Therefore, the liquid phase materials (e.g., the TMAH aqueous solution) may be heated above the boiling point of water but below the boiling point or decomposition temperature of the etching liquid (e.g., below the decomposition temperature of TMAH) to generate steam containing liquid droplets of the etching liquid (e.g., TMAH).

Thus, droplets of TMAH may remain in steam (which may also include water vapor) without decomposition. The compatibility of TMAH droplets and water vapor is advantageously employed in embodiments of the present disclosure to elevate the pad surface temperature and thus to increase the polishing rate without necessarily employing a solid-phase abrasive material. The volume ratio of TMAH to water in the TMAH aqueous solution may be in a range from 2:100 to 25:100, such as from 5:100 to 20:100, although lesser and greater volume ratios may also be employed. For CMP of materials other than silicon, the liquid phase materials may comprise the water and another liquid which acts as an etchant for the material on the wafer being polished by CMP. In one embodiment, the CMP apparatus 2000 can be free of any solid phase slurry material.

The polishing fluid dispensation system 200 further comprises a liquid delivery conduit 230 connected to the polishing fluid tank 208 and a liquid mass flow controller 220 and a vaporizer 240 located on the liquid delivery conduit. The liquid mass flow controller 220 is fluidly connected to an output orifice of the polishing fluid tank 208 through the liquid deliver conduit 230 and is configured to control the flow rate of the abrasive-free polishing fluid 210 therethrough. The vaporizer 240 is configured to convert the polishing fluid 210 into polishing fluid mixture 245. The vaporizer 240 may comprise an ultrasound wave generator and/or a heater that can be employed to convert the polishing fluid 210 into the polishing fluid mixture 245. The polishing fluid mixture 245 comprises a mixture of a vaporized gas and liquid droplets immersed in the vaporized gas. The vaporized gas may comprise steam generated by boiling the liquid water in the polishing fluid at a temperature between 100 and 130 degrees Celsius and/or by vaporizing the liquid water using ultrasound. The liquid droplets comprise liquid droplets of the etching liquid, such as TMAH liquid droplets.

In one embodiment, the polishing fluid dispensation system 200 also comprises a carrier gas source 408 and a carrier gas supply system (420, 430, 440) configured to provide a heated carrier gas 445. The carrier gas source 408 may comprise a gas tank which stores a carrier gas 410, which may comprise clean dry air or nitrogen. Alternatively, the carrier gas source 408 may comprise a blower with an air filter configured to filter particles from ambient air to generate clean dry air.

The carrier gas supply system (420, 430, 440) comprises a gas mass flow controller 420 having an input orifice that is connected to the carrier gas source 408 by a gas delivery conduit 430, and a carrier gas heater 440 connected to an output orifice of the gas mass flow controller 420 through the gas delivery conduit 430. The carrier gas heater 440 may comprise a resistive heater or a radiative gas heater configured to heat the carrier gas 410 stream flowing from the gas mass flow controller 420 to generate the heated carrier gas 445. In one embodiment, the carrier gas heater 440 is configured to provide the heated carrier gas 445 at a temperature in a range from 100 degrees Celsius to 140 degrees Celsius, such as from 105 degrees Celsius to 130 degrees Celsius.

The polishing fluid dispensation system 200 further comprises a polishing fluid conduit 260 terminating in a fan-out nozzle 280 located above the platen 110 supporting the polishing pad 112. The outlet ends of the liquid delivery conduit 230 and the gas delivery conduit 430 may be fluidly connected to the inlet of the polishing fluid conduit 260 by a mixer 262. The mixer 262 may comprise a T-shaped pipe connection or any other suitable fluid mixer. The mixer combines the gas-liquid polishing fluid mixture 245 (e.g., TMAH-steam mixture) and the heated carrier gas 445 (e.g., heated air) into a liquid-gas polishing fluid mixture 250. The temperature of the liquid-gas polishing fluid mixture 250 is higher than 100 degrees Celsius, and is less than 140 degrees Celsius. For example, the temperature of the liquid-gas polishing fluid mixture 250 in the polishing fluid conduit 260 may be in a range from 105 degrees Celsius to 130 degrees Celsius.

The polishing fluid conduit 260 terminates in the fan-out nozzle 280 that faces the polishing pad 112 has a lateral dimension that is at least 3 times a lateral dimension (such as a diameter) of the polishing fluid conduit 260. The ratio of the lateral dimension of the nozzle 280 to the lateral dimension of the polishing fluid conduit 260 may be in a range from 3 to 30, although lesser and greater ratios may also be employed. The liquid-gas polishing fluid mixture 250 is distributed over the polishing pad 112 from the fan-out nozzle as a diluted polishing fluid jet 290. The fan-out nozzle 280 is configured to spray the diluted polishing fluid jet 290 over a distribution area 292 of the polishing pad 112. In one embodiment, the distribution area 292 may have a lateral extent that is at least one half of a radius of the polishing pad 112. In one embodiment, the distribution area 292 may have a shape of an elongated rectangle. The temperature of the diluted polishing fluid jet 290 may be in range from 100 degrees Celsius to 130 degrees Celsius, such as from 105 degrees Celsius to 125 degrees Celsius, and/or from 110 degrees Celsius to 120 degrees Celsius.

The pad conditioning unit (130, 132) can be used to precondition the polishing pad 112 prior to and/or during the CMP process that is used to polish material portions located over the front surface of the wafer 41 that contacts the top surface of the polishing pad 112. In one embodiment, the pad conditioning unit (130, 132) can include a pad conditioning disk 130 and a conditioning head 132 that is configured to hold the pad conditioning disk 130. The pad conditioning disk 130 includes an abrasive bottom surface that can precondition the top surface of the polishing pad 112. The pad conditioning disk 130 can be attached to the conditioning head 132 in a manner that provides rotation of the pad conditioning disk 130 around a vertical axis (not shown) passing through the geometrical center of the pad conditioning disk 130 without falling out from the conditioning head 132.

A conditioner pivot pillar structure 134 can be affixed to a frame (not shown) of the CMP apparatus such that the conditioner pivot pillar structure 134 can rotate around a vertical axis (not shown) passing through the geometrical center of the conditioner pivot pillar structure 134. The vertical axis passing through the geometrical center of the conditioner pivot pillar structure 134 can be stationary relative to the frame of the CMP apparatus.

A pad conditioner arm 136 mechanically connects the conditioning head 132 to the conditioner pivot pillar structure 134. A pad conditioner arm 136 mechanically connects the conditioning head 132 to the conditioner pivot pillar structure 134. Thus, upon rotation of the conditioner pivot pillar structure 134 around the vertical axis passing through the geometrical center of the conditioner pivot pillar structure 134, the pad conditioner arm 136 can rotate around the vertical axis passing through the geometrical center of the conditioner pivot pillar structure 134. The conditioning head 132 can move around the vertical axis passing through the geometrical center of the conditioner pivot pillar structure 134 over the polishing pad 112. Lateral movement of the pad conditioning unit (130, 132) over the polishing pad 112 can enhance uniformity of the surface condition of the polishing pad 112 after the pad pre-conditioning process.

The CMP apparatus 2000 of the embodiments of the present disclosure can include a process controller 300 electrically connected (e.g., via wired and/or wireless connections) to electrical components that control movement of various mechanical parts of the CMP apparatus. For example, the process controller 300 can be electrically connected to, and can be configured to control operation of, each of the platen motor assembly 108, the polishing pivot pillar structure 144, the wafer polishing unit (140, 142), the conditioner pivot pillar structure 134, the pad conditioning unit (130, 132), and the polishing fluid dispensation system 200. For example, the process controller 300 can control the rotational speed of the platen 110, the polishing pivot pillar structure 144, the wafer carrier 140, the conditioner pivot pillar structure 134, and the pad conditioning disk 130, and can control the location of the polishing fluid dispensation point and the rate of polishing fluid dispensation.

The slider 138 can be used to control a temperature of the polishing pad 112. The slider 138 can be fluidly connected by water conduits (e.g., pipes, not shown for clarity) to a water supply system (not shown for clarity) which provides room temperature cooling water and hot water to the slider 138 to assist in controlling the temperature of the polishing pad 112. The process controller 300 can also be configured to control operation of the slider 138 by actuating cooling water and hot water valves which control the flow of the cooling water and the hot water through the respective conduits to the slider 138. Alternatively, the slider 138 may be omitted.

Generally, the CMP apparatus 2000 according to various embodiments can include a polishing pad 112 located on a top surface of a platen 110 configured to rotate around a vertical axis VA passing through the platen 110, a wafer carrier 140 that holds a wafer 41 and facing the polishing pad 112, a polishing fluid dispensation system 200 configured to dispense the liquid-gas polishing fluid mixture 250 over the polishing pad 112, and a process controller 300 configured to control operation of components of the CMP apparatus 2000. For example, the process controller 300 may control the rotation speed of the platen 110, the rotation speed of the wafer carrier 140, the downforce that the wafer carrier 140 applies to the polishing pad 112, the operation of the pad conditioning unit (130, 132), the slider 138, the vaporizer 240, the heater 440 and/or the mass flow controllers (220, 420).

In one embodiment, the CMP apparatus 2000 also comprises a temperature monitor 180 configured to monitor a temperature of a monitored area 182 of the polishing pad 112. The temperature monitor 180 may comprise a pyrometer that is located above the polishing pad 112 at a fixed location, and that faces the monitored area 182 of the polishing pad 112. In one embodiment, the process controller 300 may be configured to receive data on the temperature of the monitored area 182 of the polishing pad 112, to control the temperature of heated carrier gas 445 by controlling the temperature of the heater 440 and/or to control the temperature of the polishing fluid mixture by controlling the vaporizer 240 operation, based on the received data from the temperature monitor 180. This in turn controls the temperature of the jet 290 comprising the liquid-gas polishing fluid mixture 250.

Dependence of the polishing rate during the CMP process on the pad temperature is generally described by the Arrhenius equation. When the temperature of the polishing pad 112 increases, the polishing rate increases. The polishing rate of a CMP process performed employing the CMP system 10 of the present disclosure may be maintained at a uniform preset value by stabilizing the temperature of the liquid-gas polishing fluid mixture 250, and thus, the temperature of the polishing pad 112.

In one embodiment, the process controller 300 is configured to maintain the temperature of the monitored area 182 of the polishing pad 112 in a range from 60 degrees Celsius to 90 degrees Celsius. In one embodiment, the process controller 300 may be configured to further open the mass flow controller 420 to increase a flow rate of a heated carrier gas 445 through the gas supply conduit 430 into the mixer 262 and/or to reduce an amount of heat applied by the heater 440 to the carrier gas 410 if the temperature of the monitored area 182 measured by the temperature detector 180 is above a target temperature. Alternatively, the process controller 300 may be configured to partially close the mass flow controller 420 to decrease a flow rate of a heated carrier gas 445 through the gas supply conduit 430 into the mixer 262 and/or to increase an amount of heat applied by the heater 440 to the carrier gas 410 if the temperature of the monitored area 182 measured by the temperature detector 180 is below a target temperature.

Generally, the process controller 300 may comprise a pad temperature controller program, which automatically controls the liquid flow rate of the polishing fluid 210, the flow rate of the carrier gas 410 (such as clean dry air) that is supplied to the carrier gas heater 440, and/or the temperature of the carrier gas heater 440. The temperature of the liquid-gas polishing fluid mixture 250 may be increased by increasing the power applied to the carrier gas heater 440 and/or by decreasing the volume of the carrier gas flow through the mass flow controller 420. The temperature of the liquid-gas polishing fluid mixture 250 may be decreased by decreasing the power applied to the carrier gas heater 440 and/or by increasing the volume of the carrier gas flow through the mass flow controller 420. Usage of the polishing fluid 210 may be reduced by maintaining a flow of the carrier gas 410 through the carrier gas heater 440 and the fan-out nozzle 292, while opening the mass flow controller 220 to permit flow of the polishing fluid 210 through the liquid mass flow controller 220 only during a polishing step during which the wafer 41 is polished.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A chemical mechanical polishing (CMP) method, comprising:

providing an aqueous tetramethylammonium hydroxide (TMAH) solution;

at least partially evaporating water in the aqueous TMAH solution to form a polishing fluid mixture;

mixing the polishing fluid mixture with a heated carrier gas to form a liquid-gas polishing fluid mixture comprising steam and liquid TMAH droplets;

providing the liquid-gas polishing fluid mixture to a polishing pad; and polishing a surface of a wafer on the polishing pad using the liquid-gas polishing fluid mixture, wherein the liquid TMAH droplets act as an etchant for a material comprising silicon located on the surface the wafer.

2. The CMP method of claim 1, wherein the carrier gas comprises heated air.

3. The CMP method of claim 1, wherein the at least partially evaporating the water in the aqueous TMAH solution comprises thermally or ultrasonically evaporating the water.

4. The CMP method of claim 1, wherein at least partially evaporating the water in the aqueous TMAH solution comprises heating the water to a temperature between 100 and 140 degrees Celsius which at least partially evaporates the water without decomposing the TMAH droplets.

5. The CMP method of claim 1, further comprising:

monitoring a temperature of the polishing pad;

increasing a temperature of the liquid-gas polishing fluid mixture if the monitored temperature of the polishing pad is below a target temperature range; and decreasing a temperature of the liquid-gas polishing fluid mixture if the monitored temperature of the polishing pad is above a target temperature range.

6. The CMP method of claim 5, wherein:

the increasing the temperature of the liquid-gas polishing fluid mixture comprises increasing a temperature of the heated carrier gas or decreasing a volume of the heated carrier gas; and the decreasing the temperature of the liquid-gas polishing fluid mixture comprises decreasing a temperature of the heated carrier gas or increasing a volume of the heated carrier gas.

7. The CMP method of claim 1, wherein the liquid-gas polishing fluid mixture is free from solid abrasive particles.

8. The CMP method of claim 1, wherein the providing the liquid-gas polishing fluid mixture to the polishing pad comprises spraying a jet of the liquid-gas polishing fluid mixture from a diverging nozzle onto a surface of the polishing pad.

* * * * *